US008891603B2

(12) United States Patent
Tan et al.

(10) Patent No.: US 8,891,603 B2
(45) Date of Patent: Nov. 18, 2014

(54) RE-SAMPLING S-PARAMETERS FOR SERIAL DATA LINK ANALYSIS

(75) Inventors: Kan Tan, Portland, OR (US); John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 226 days.

(21) Appl. No.: 13/531,917

(22) Filed: Jun. 25, 2012

(65) Prior Publication Data
US 2013/0343442 A1 Dec. 26, 2013

(51) Int. Cl.
*H04B 3/46* (2006.01)
*H04B 17/00* (2006.01)
*H04Q 1/20* (2006.01)

(52) U.S. Cl.
USPC .......................................................... 375/224

(58) Field of Classification Search
CPC ..................................................... H04B 7/0456
USPC ........................................................... 375/224
See application file for complete search history.

(56) References Cited

U.S. PATENT DOCUMENTS

| 2007/0073499 | A1 | 3/2007 | Sawyer et al. |
| 2009/0195498 | A1 | 8/2009 | Karapattu et al. |
| 2010/0303165 | A1* | 12/2010 | Gore et al. .................... 375/260 |
| 2011/0286506 | A1 | 11/2011 | Libby et al. |
| 2013/0158922 | A1* | 6/2013 | Fertner et al. .................. 702/70 |

OTHER PUBLICATIONS

European Search Report and Written Opinion for Application No. 13172503.8, dated Nov. 13, 2013, 4 pages.

* cited by examiner

*Primary Examiner* — Tanmay Shah
(74) *Attorney, Agent, or Firm* — Meagher Emanuel Laks Roehling & Goldberg, LLP; Thomas F. Lenihan (57) ABSTRACT

A device and method of re-sampling a plurality of S-parameters for serial data link analysis is disclosed. The method includes storing a plurality of S-parameters sets, each S-parameter set being associated with a subsystem and having associated impulse responses and a time interval. An increased time interval is determined based on the time interval associated with each S-parameter set. The impulse responses are zero filled in each S-parameter set to maintain any wrapped ripples and increase the time interval. A plurality of resampled S-parameter sets are generated with a finer frequency resolution to cover the increased time interval.

21 Claims, 11 Drawing Sheets

RE-SAMPLING S-PARAMETERS FOR SERIAL DATA LINK ANALYSIS

FIELD OF INVENTION

This invention relates generally to signal acquisition and analysis systems and, more particularly, to a system, apparatus and method for re-sampling S-parameters for serial data link analysis.

BACKGROUND

In high speed serial data link systems and in RF systems, S-parameters are often used characteristic system behavior. S-parameters are generally used to characterize n-port networks. A complex system may be composed of multiple subsystems. Each subsystem may be represented by one S-parameter set. There is a need to combine these S-parameter sets to obtain the S-parameter model for the complete system. For example, multiple sets of S-parameters may be cascaded to obtain a combined overall characteristic for multiple devices connected together. It is required that S-parameter data needs to cover a specific bandwidth of interest. It is also required that the S parameter data needs to have frequency resolution that is fine enough to prevent aliasing in the time domain. This means that the frequency resolution needs to be fine enough to provide a time interval long enough to cover the impulse response duration of the system. Even though all the S-parameter data for an individual sub-system may have appropriate frequency resolution, the same frequency resolution may become inadequate when combining them together in a cascade. For example, the combined system may have longer impulse response duration because of longer propagation time and multiple reflections. There is a need for improved resampling techniques for S-parameter data that allows for combination of multiple S-parameter sets without introducing errors, e.g., aliasing errors.

SUMMARY OF THE INVENTION

A method of re-sampling a plurality of S-parameters for serial data link analysis is disclosed. The method includes storing a plurality of S-parameters sets, each S-parameter set being associated with a subsystem and having associated impulse responses and a time interval. An increased time interval is determined based on the time interval associated with each S-parameter set. The impulse responses are zero filled in each S-parameter set to maintain any wrapped ripples and increase the time interval. A plurality of resampled S-parameter sets are generated with a finer frequency resolution to cover the increased time interval.

The impulse responses in each S-parameter set may be zero filled at a zero fill location based on a ripple threshold. The impulse responses in each S-parameter set may be zero filled at a zero fill location based on a percentage of the time interval associated with each S-parameter set. Each S-parameter set may be extrapolated to DC for any S-parameters sets that don't have a DC value. The method may further include determining a maximum common frequency for all of the S-parameter sets and extrapolating each S-parameter set to beyond the maximum common frequency.

The extrapolated frequency domain S-parameters may be converted to time domain impulse responses using an Inverse Fast Fourier Transform (IFFT). An actual common sample period may be determined between the impulse responses based on a sample rate associated with each of the S-parameters sets. The time domain zero filled S-parameters impulses may be converted to frequency domain using a Fast Fourier Transform (FFT). Lower frequency and high frequency points that are extrapolated may also be truncated.

A serial data link analysis device is also disclosed. The device includes a memory configured to storing a plurality of S-parameters sets, each S-parameter set being associated with a subsystem and having associated impulse responses and a time interval. The device also includes a processor configured to determine an increased time interval based on the time interval associated with of each S-parameter set. The processor is also configured to zero fill the impulse responses in each S-parameter set to maintain any wrapped ripples and increase the time interval and generate a plurality of resampled S-parameter sets with a finer frequency resolution to cover the increased time interval.

The processor may be configured to zero fill the impulse responses in each S-parameter set at a zero fill location based on a ripple threshold. The processor may be configured to zero filled the impulse responses in each S-parameter set at a zero fill location based on a percentage of the time interval associated with each S-parameter set. The processor may be configured extrapolate each S-parameter set to DC for any S-parameters sets that don't have a DC value. The processor may be configured to determine a maximum common frequency for all of the S-parameter sets and extrapolate each S-parameter set to beyond the maximum common frequency.

The processor may be configured to convert the extrapolated frequency domain S-parameters to time domain impulse responses using an Inverse Fast Fourier Transform (IFFT). The processor may be configured to determine an actual common sample period between the impulse responses based on a sample rate associated with each of the S-parameters sets. The processor may be configured to convert the time domain zero filled S-parameters impulses to frequency domain using a Fast Fourier Transform (FFT). The processor may be configured to truncate lower frequency and high frequency points that are extrapolated.

DETAILED DESCRIPTION OF THE INVENTION

Serial data link applications (SDLA) are an important feature of high performance oscilloscopes. Such applications allow users to model the function of a given design using S-parameters representing their devices and test fixtures. The SDLA can convert these S-parameters into FIR filters which are applied to acquired waveforms to allow test fixtures and probes to be de-embedded from a measurement. They also allow the user to simulate the effects a serial channel would have on the acquired signal. Users can also use the application to simulate transmitter (Tx) and receiver (Rx) equalizers.

Figure 1:
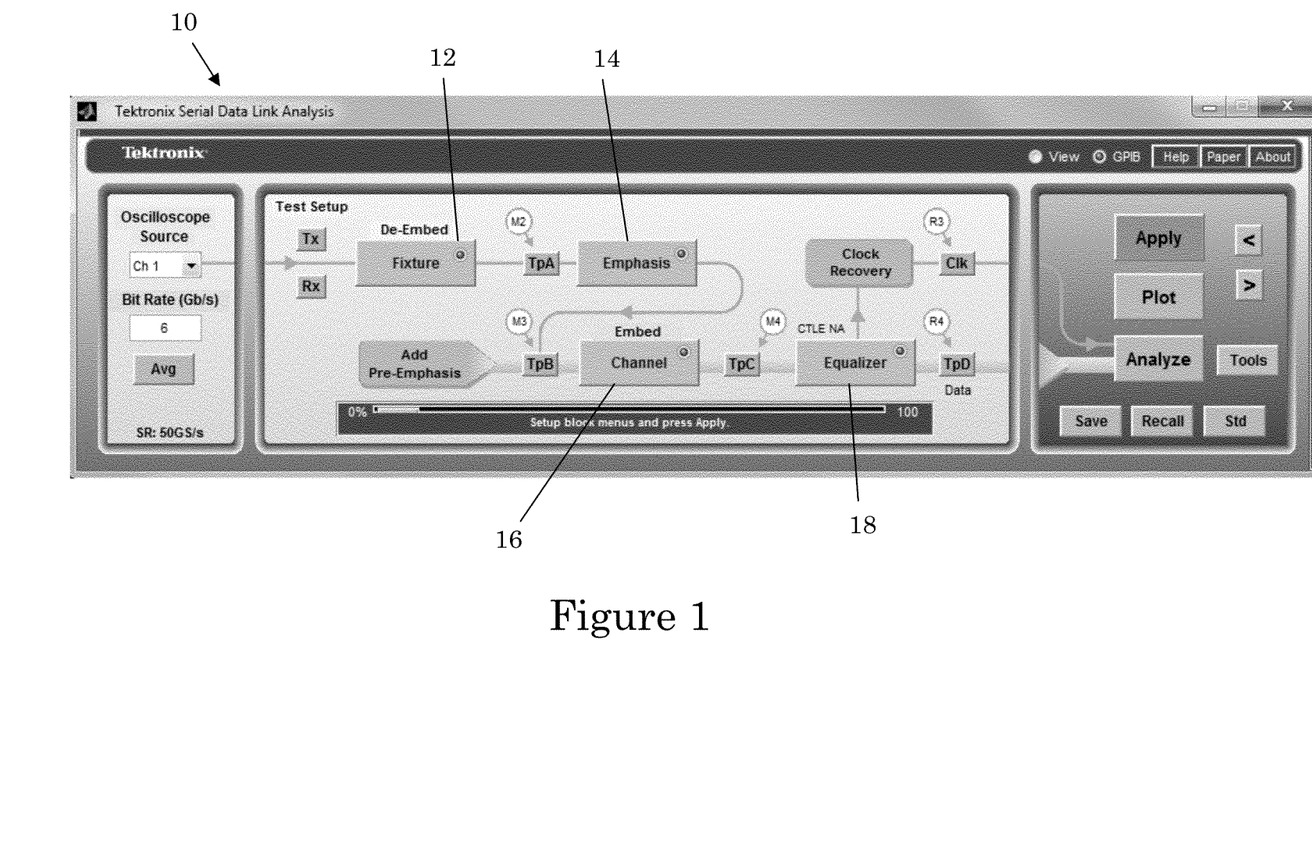
FIG. 1 is a block diagram of a signal path window from a serial data link application.

FIG. 1 shows a block diagram of a signal path window 10 from a SDLA. In this example, the SDLA is configured to model the full signal path. In this example, the signal path includes four circuit blocks including a fixture circuit block 12, emphasis circuit block 14 (transmitter Tx), channel circuit block 16 and an equalizer circuit block 18 (receiver Rx).

An SDLA oscilloscope source signal is coupled to one of the oscilloscope channels, e.g., channel 1, and is acquired through fixture from the transmitter output. The oscilloscope source signal is typically digitized and stored in memory prior to running a serial data link analysis. Test points TpA-TpD allow the user to monitor the effects of the individual circuit blocks on the source signal. In this example, fixture circuit block 12 has associated S-parameters to represent the fixture, and emphasis circuit block 14 can represent the transmitter equalizer. The channel circuit block 16 has associated S-parameters and simulates the transmission channel. The equalizer circuit block 18 also has an associated Continuous Time Linear Equalization, Feed Forward Equalization and/or Decision Feedback Equalization (CTLE/FFE/DFE) definition and simulates the receiver equalizer. It should be understood that each circuit block may simulate multiple components each of which may have associated with S-parameters.

Figure 2:
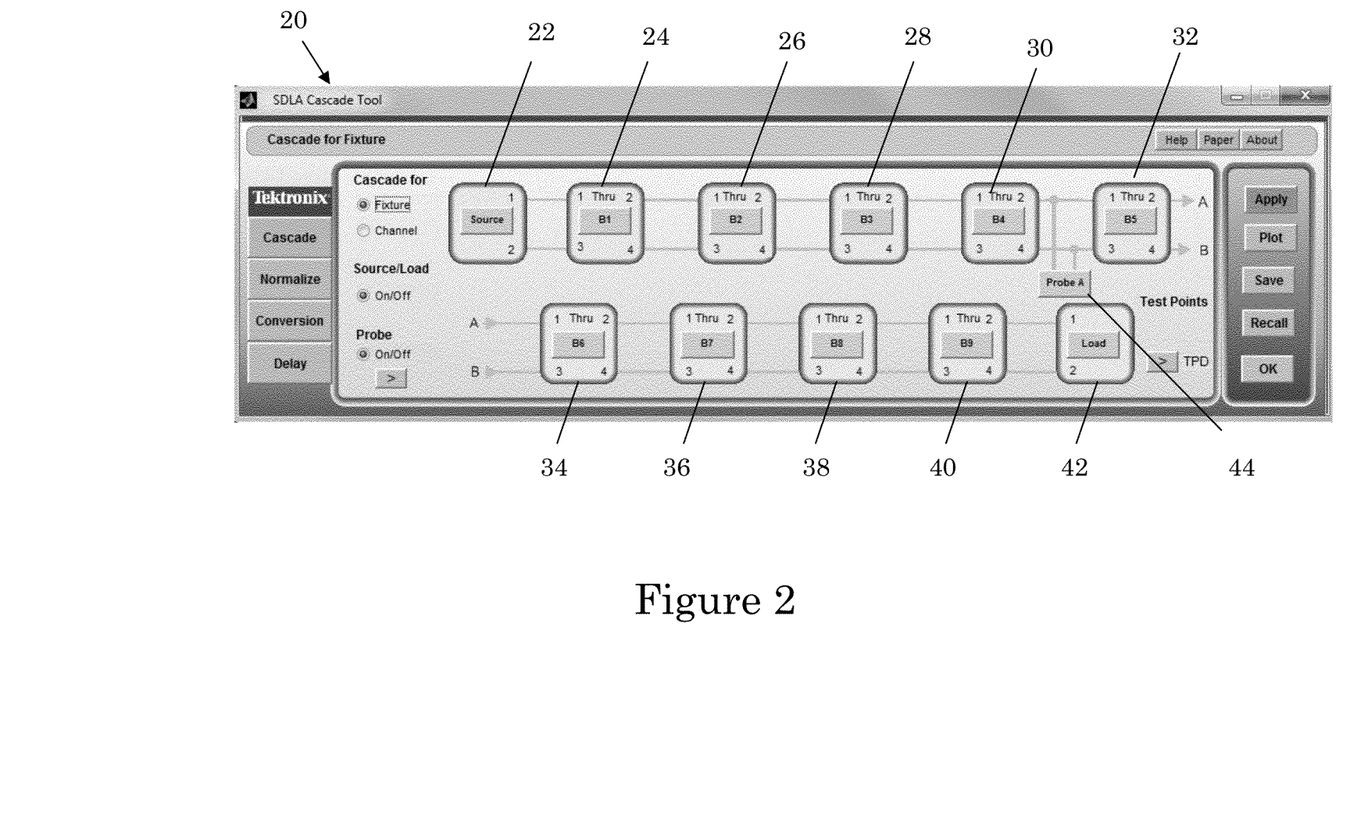
FIG. 2 is a block diagram showing an SDLA signal path window that includes the capability to cascade multiple blocks of 4-port S-parameters.

FIG. 2 is a block diagram showing an SDLA cascade tool 20 that includes the capability to cascade multiple blocks of 4-port S-parameters. In this example, the s-parameter blocks 24-40 are arranged in a cascade used to simulate the individual components that make up fixture circuit block 12 (FIG. 1). The SDLA also allows an S-parameter set for a probe 44 to be placed in parallel with any point in the cascade.

The source 22 and load blocks 42 represent the loading at each end of the cascade. Each of the blocks 24-40 in the cascade are represented by 4-port S-parameters. The 4-port S-parameters may be obtained from measured data or derived from a simulated circuit. Each block may be configured as one full 4-port S-parameter set or it can be configured from the combination of two 2-port S-parameters. In addition RLC or transmission line circuit models may be provided in the block and the S-parameters for the block may then be derived from these models.

Figure 3:
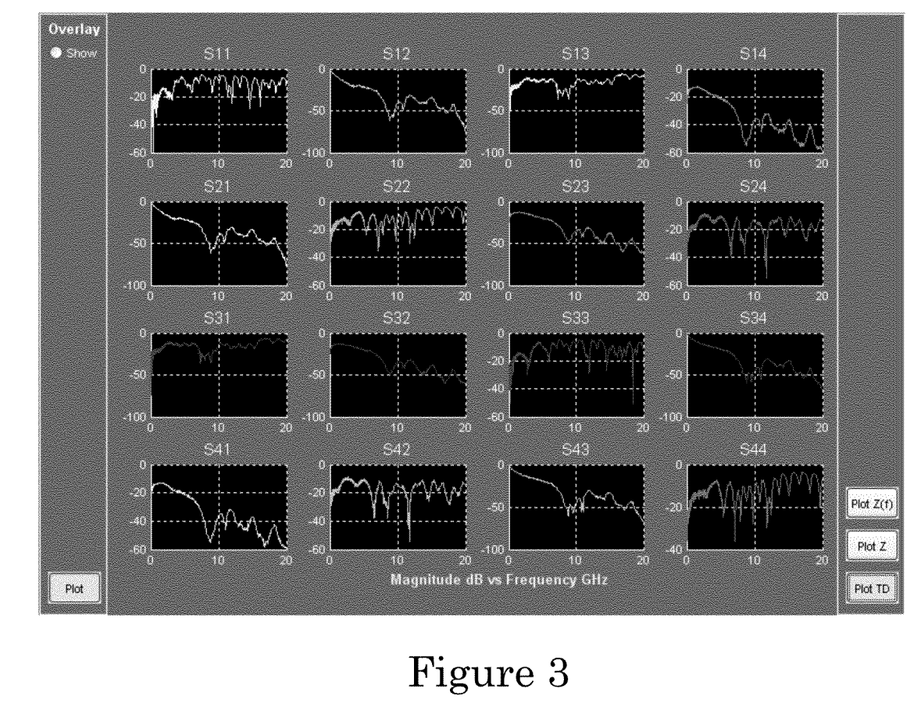
FIG. 3 is a set of graphs showing the frequency domain magnitude plots for all 16 S-parameter vectors in a 4-port S-parameter set.
Figure 4:
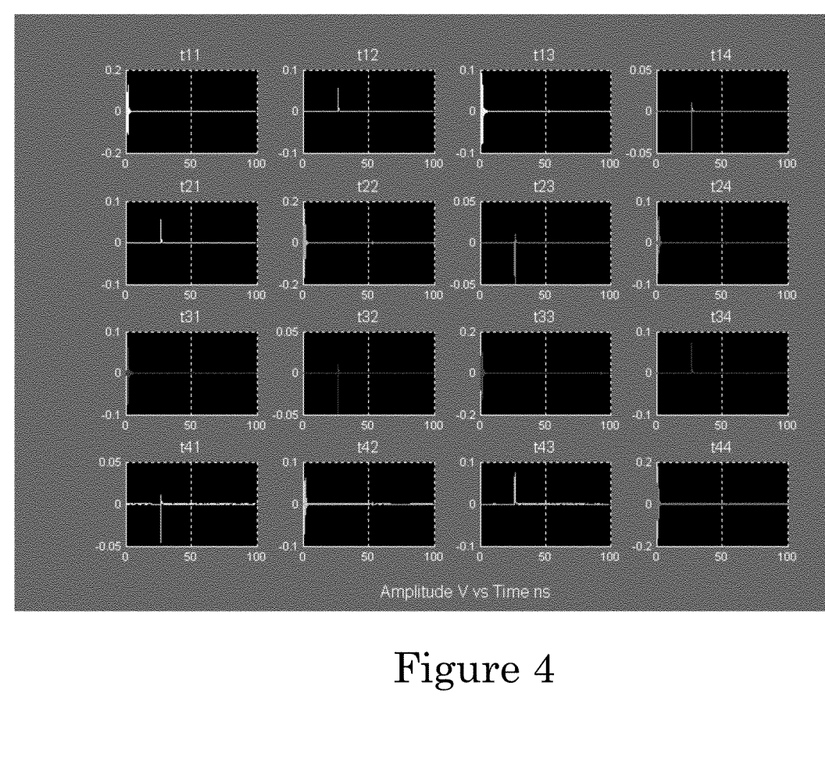
FIG. 4 is a set of graphs showing the time domain impulse response representation of each of the S-parameter vectors in FIG. 3.

FIG. 3 is a set of graphs showing the frequency domain magnitude plots for all 16 S-parameter vectors in a 4-port S-parameter set. FIG. 4 is a set of graphs showing the time domain impulse response representation of each of the S-parameter vectors in FIG. 3. S-parameters may be measured via a variety of techniques. When a set of S-parameters is measured using a vector network analyzer (VNA), a sine wave incident signal is placed on a port. For reflection coefficients the reflected sine wave magnitude and phase are measured. All other ports are terminated with reference impedance resistors. The ratio of reflected and incident signals is represented as S11, S22, S33, or S44. This process is repeated for a range of frequencies. For S21 a sine wave is placed on port 1 and measured on port 2 and their ratio becomes S21. This process requires that the sine waves are at steady state after all reflections and transmissions have stabilized.

If an S-parameter set is measured with Time-Domain Reflectometer (TDR) steps then incident, reflected and transmitted waveforms are obtained in the time domain, then a derivative may be performed on the steps to get the impulse responses appearing as shown in FIG. 4. Measuring a valid S-parameter set also requires that the time domain waveforms are settled and have reached a steady state by the end of the time interval. These waveforms may then be transformed to the frequency domain by using a Fast Fourier Transform (FFT). The result is essentially equivalent to the measurements made via the VNA using sine waves.

The frequency spacing of the VNA measured data will determine the number of samples up to the sample rate frequency at which the time domain waveforms are to be represented. The smaller the frequency spacing, the more samples there are and the longer the time interval will be. If the frequency spacing is too large and the resulting time interval is too short for the time domain data to be settled, then time domain aliasing occurs. This results in the time domain signal being wrapped to incorrect positions. The equation to determine the time interval is given below:

$$T=1/\Delta f$$

Where T is the time interval covered by the S-parameter set, and $\Delta f$ is the frequency spacing. This inverse relationship infers that in order to cover a longer T, the $\Delta f$ needs to be smaller. This results in a finer frequency resolution which in turn results in a larger number of frequency domain samples up to the Nyquist frequency determined by desired sample rate.

The number of samples, N, may be computed from the following equation:

$$N=0.5fs/\Delta f$$

Where fs is the sample rate. 0.5fs is the Nyquist frequency. The number of frequency domain samples is proportional to the number of time domain samples when the IFFT is computed to obtain the time domain response. Therefore, the time interval is longer for a given sample rate when $\Delta f$ is made smaller.

A problem occurs when S-parameter blocks are combined. These S-parameter blocks may have been obtained from different sources or laboratories and may not have been sampled with the same frequency spacing, or number of points.

Figure 5:
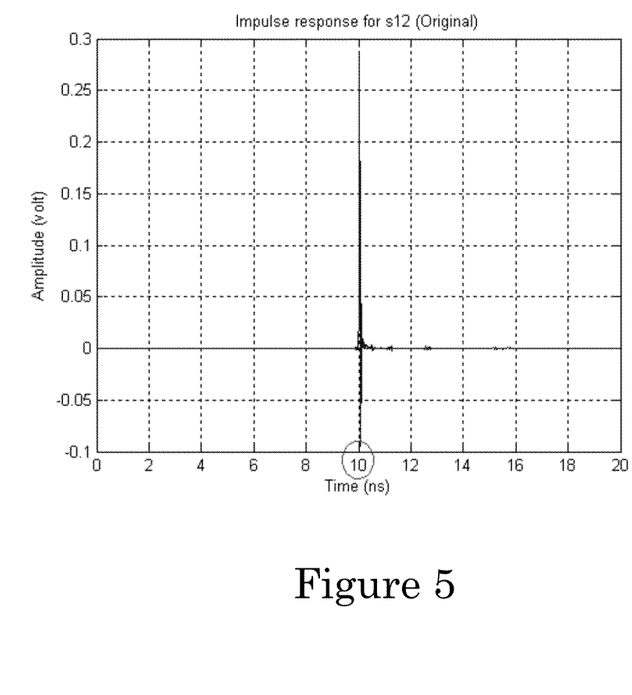
FIG. 5 is a graph of the S12 impulse response for a single block with a time duration of 20 ns.
Figure 6:
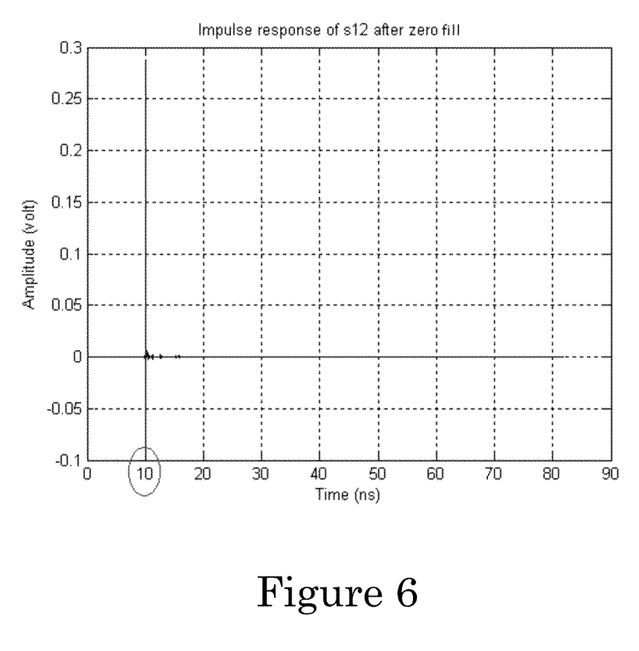
FIG. 6 is a graph showing the impulse response of resampled S12 S-parameter with a time duration of 90 ns.

To illustrate the problems involved consider the following example where three blocks are to be cascaded. Assume that all blocks are the same and their s12 data has the impulse response shown in FIG. 5. It is observed from the figure that the propagation delay is about 10 ns. The S-parameter's frequency spacing of 50 MHz covers time interval of 20 ns. This may be sufficient for this s12 data set when considering only a single block. When three of these S-parameter blocks are cascaded, the total propagation delay would be 30 ns. Using the same frequency spacing is no longer sufficient to cover the cascaded blocks. This example demonstrates an issue addressed by this disclosure. The individual S-parameters must be resampled to provide smaller frequency spacing to cover the increased time interval for the combined S-parameters. FIG. 6 is a graph showing the impulse response of resampled s12 that covers 90 ns. This time interval is sufficient to cover a total propagation delay of 30 ns.

Various approaches can be taken to address the resampling problem. For example, one approach is to perform interpolation in the frequency domain. This may be done by either interpolating the real and imaginary components, or it may be done by interpolating the magnitude and phase components.

The following is an improved approach for resampling multiple S parameters that potentially have different frequency spacing and different bandwidth:

1. Extrapolate all S-parameters data to DC if the S-parameters don't have a DC value. Usually S-parameters measured from a VNA do not have a DC value. TDR measured S-parameters typically have a DC value.

2. Determine the common maximum frequency for all of the S-parameter sets. This value may be the maximum frequency of all of the S-parameter sets in the cascade. Extrapolate each S-parameter set to beyond the maximum common frequency.

3. Convert extrapolated frequency domain S-parameters to time domain impulse responses using an inverse FFT (IFFT).

4. Determine the actual common sample period between the impulse responses. The actual common sample period can be taken as the minimum of sample periods of the impulse responses. The impulse responses are then resampled so they all have same sample rate.

5. Zero fill the impulse responses at proper positions, as described below, to yield increased time interval. The increased time interval can be determined as multiples of sum of all the time intervals represented by each S-parameter.

6. Convert time domain zero filled impulses to frequency domain using FFT.

7. Truncate the lower frequency and high frequency points that are extrapolated (optional).

8. At this point all S-parameters have been resampled at the same frequency points with sufficient frequency resolution. For each frequency point, combine the S-parameters for each block to be cascaded. This may be done directly or through T-parameters to get the combined S parameter. Additional information on the combination of S-Parameters is available in the following publications which are incorporated herein in their entirety: "S-parameter design", Agilent Technologies Application Note, 1972 and "RF and microwave coupled-line circuits", Artech House, 1999, Rajesh Mongia, Inder Bahl and Prakash Bhartia.

As explained above, the impulse responses are zero-filled at proper positions to yield an increased time interval. The position of zero filling is not arbitrary and it is not necessarily started at the end of right side of the time domain response.

For all of the impulse responses in the S-parameter set the, the zero phase time reference position is at the beginning of the time record. If the data were all ideal the zero fill would be added to the right side of the record. However, the leakage from IFFT calculations can sometimes result in ripple from the beginning of the time record being wrapped to the end of the time record. Therefore, the impulse responses obtained from step 4 can have some ripple response at the end of the time record. This ripple response at the end the impulse response is caused by band limited nature of S-parameters and is affected by sample offset.

Figure 7:
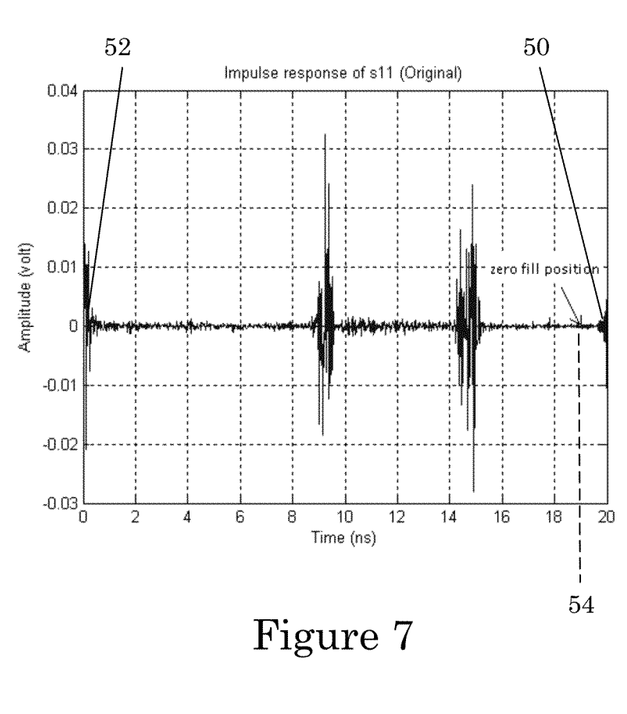
FIG. 7 is a graph showing the impulse response for an S11 data sample.

For example, FIG. 7 is a graph showing the impulse response for an S11 data sample obtained in step 4 above. The small ripples at the end are wrapped from the left end 52 to the right end 50. Regular zero padding, where zeros are padded to the right end of the impulse response would yield an S-parameter set with errors. This example demonstrates another problem addressed by this disclosure. Zeros must be filled at the proper zero fill position 54 to maintain the wrapped ripples at the end of the impulse response. To address this zero fill requirement, the following two options may be used to find the proper zero fill position.

Figure 8:
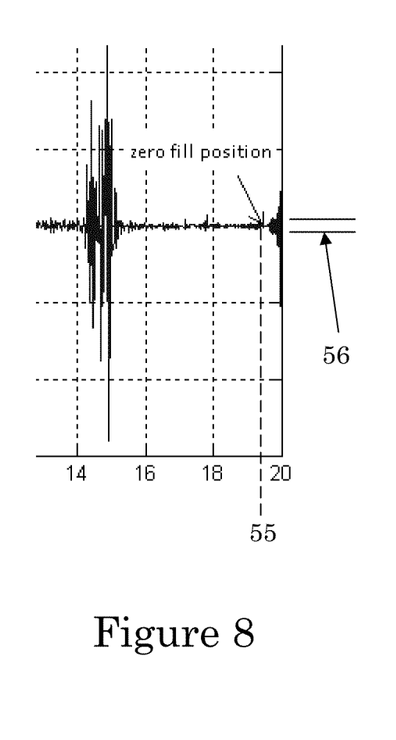
FIG. 8 is a graph showing the zero fill position after the ripples settle.

Option 1—threshold based: Starting from the end, e.g., right side, of the impulse response, determine if there is ripple at the end. If there is no ripple, then the zeros can be filled right after the last point of the impulse response. If there are ripples, then search backwards to find the position where the ripples settle, e.g., below a predetermined ripple threshold 56. Zeros can be filled in the settled position 55 as shown in FIG. 8.

Option 2—percentage based: Select a predetermined percentage of the impulse response to locate the zero fill position. For example, zero fill at a position of 5% from the end. For example, the zero-fill position 54 is located at 19 ns, 5% from the end of the 20 ns sample shown in FIG. 7.

Figure 9:
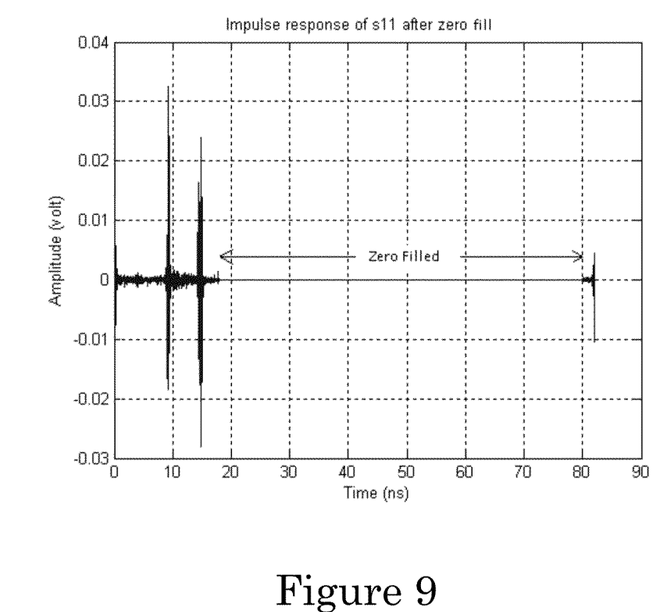
FIG. 9 is a graph showing zero fill after the zero fill position is located.
Figure 10:
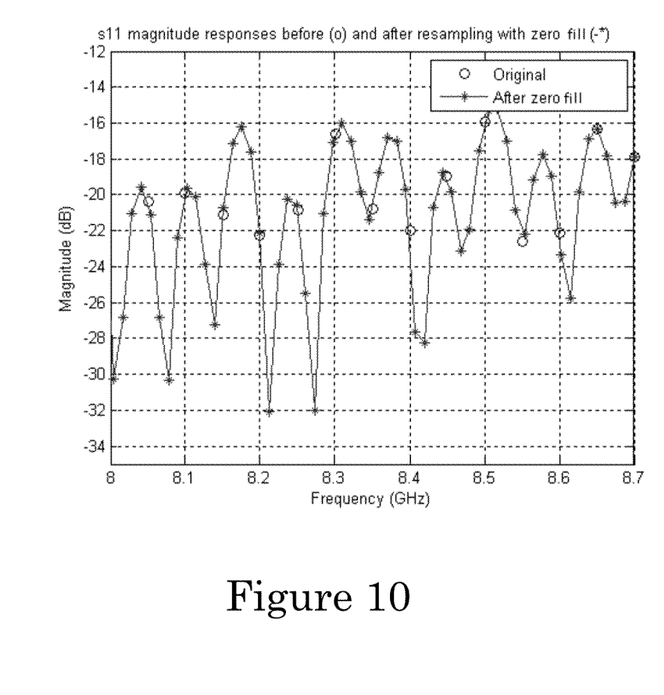
FIG. 10 is a graph showing resampled S-parameters as compared to original S-parameters.

FIG. 9 is a graph showing zero fill after the zero fill position is located using one of the above options. Using the techniques disclosed above, the resampled S-parameters are matched well with the original S-parameters, as shown in FIG. 10.

The disclosed re-sampling techniques provide a variety of advantages over previously known techniques. They provide a robust, easy to implement, and fast way to re-sample S-parameters to obtain sufficient frequency resolution and uniform frequency samples. This results in S-parameters that can be combined without aliasing. Some approaches default to using the most coarse frequency resolution of S-parameter sets. This is most likely to cause aliasing which cannot be easily detected.

Re-sampling the frequency domain complex S-parameters using the time domain real impulse response is more robust compared to directly resampling complex frequency domain data. This procedure uses FFT/IFFT which is computation is more efficient than other approaches.

The disclosed zero filling positioning method is different than known zero padding methods. These techniques provide better frequency responses, for the common use cases of S-parameters, where the S-parameters are band limited and sample offset can be arbitrary.

Figure 11:
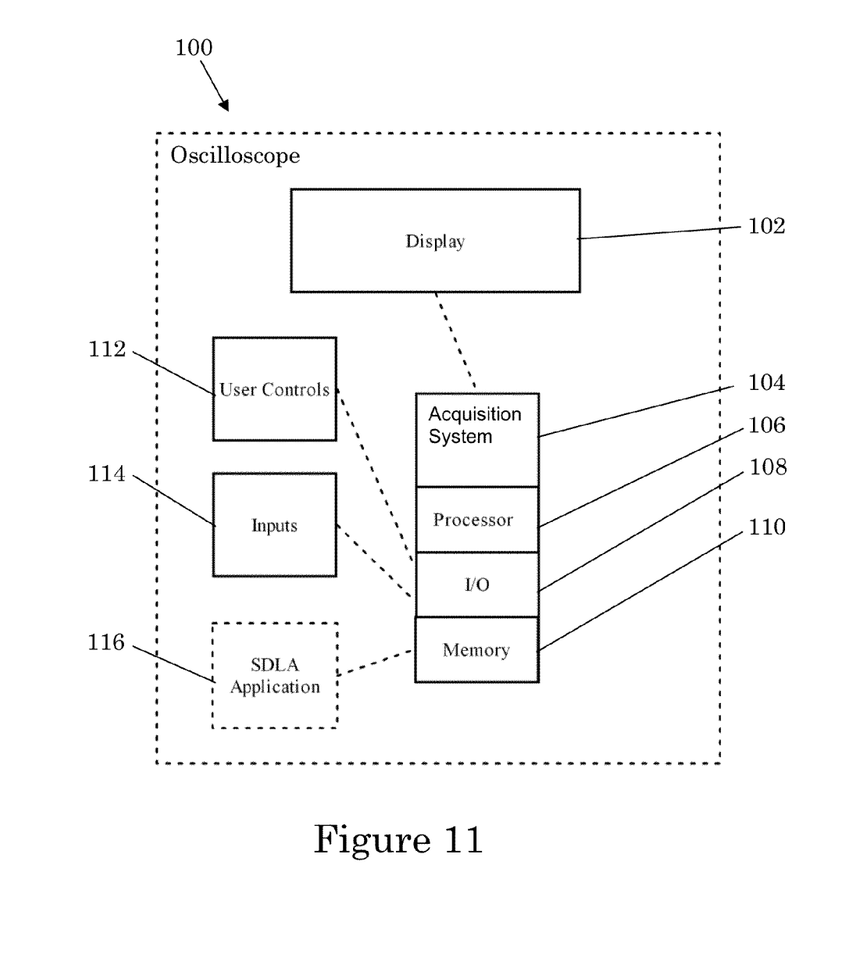
FIG. 11 is a block diagram of a test and measurement instrument configured to carry out serial data link analysis.

FIG. 11 is a block diagram of a test and measurement instrument configured to carry out the above techniques. In this case, the instrument 100 is an oscilloscope having a display 102 and an acquisition system 104. The acquisition system 104 includes a processor 106 with associated memory 110 and input/output circuitry 108. A variety of user controls 112 and electrical inputs 114 are coupled to the acquisition system 104. The processor 106 is also configured to run the SDLA application as explained in detailed above.

It should be understood that many variations are possible based on the disclosure herein. Although features and elements are described above in particular combinations, each feature or element can be used alone without the other features and elements or in various combinations with or without other features and elements. The methods or flow charts provided herein may be implemented in a computer program, software, or firmware incorporated in a computer-readable (non-transitory) storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

What is claimed is:

1. A method of re-sampling a plurality of S-parameters for serial data link analysis, the method comprising:

storing a plurality of S-parameters sets, each S-parameter set being associated with a subsystem and having associated impulse responses and a time interval;

determining an increased time interval based on the time interval associated with each S-parameter set;

zero filling the impulse responses in each S-parameter set to maintain any wrapped ripples and increase the time interval and generating a plurality of resampled S-parameter sets with a finer frequency resolution to cover the increased time interval.

2. The method of claim 1 wherein the impulse responses in each S-parameter set are zero filled at a zero fill location based on a ripple threshold.

3. The method of claim 1 wherein the impulse responses in each S-parameter set are zero filled at a zero fill location based on a percentage of the time interval associated with each S-parameter set.

4. The method of claim 1 further comprising extrapolating each S-parameter set to DC for any S-parameters sets that don't have a DC value.

5. The method of claim 1 further comprising:
determining a maximum common frequency for all of the S-parameter sets; and
extrapolating each S-parameter set to beyond the maximum common frequency.

6. The method of claim 5 further comprising converting extrapolated frequency domain S-parameters to time domain impulse responses using an Inverse Fast Fourier Transform (IFFT).

7. The method of claim 1 further comprising determining an actual common sample period between the impulse responses based on a sample rate associated with each of the S-parameters sets.

8. The method of claim 1 further comprising converting time domain zero filled S-parameters impulses to frequency domain using a Fast Fourier Transform (FFT).

9. The method of claim 5 further comprising truncating lower frequency and high frequency points that are extrapolated.

10. A serial data link analysis device comprising:
a memory configured to storing a plurality of S-parameters sets, each S-parameter set being associated with a subsystem and having associated impulse responses and a time interval;
a processor configured to determine an increased time interval based on the time interval associated with each S-parameter set;
the processor being configured to zero fill the impulse responses in each S-parameter set to maintain any wrapped ripples and increase the time interval and generate a plurality of resampled S-parameter sets with a finer frequency resolution to cover the increased time interval.

11. The device of claim 10 wherein the impulse responses in each S-parameter set are zero filled at a zero fill location based on a ripple threshold.

12. The device of claim 10 wherein the impulse responses in each S-parameter set are zero filled at a zero fill location based on a percentage of the time interval associated with each S-parameter set.

13. The device of claim 10 wherein the processor is configured to extrapolate each S-parameter set to DC for any S-parameters sets that don't have a DC value.

14. The device of claim 10 wherein the processor is configured to determine a maximum common frequency for all of the S-parameter sets and extrapolate each S-parameter set to beyond the maximum common frequency.

15. The device of claim 14 wherein the processor is configured to convert extrapolated frequency domain S-parameters to time domain impulse responses using an Inverse Fast Fourier Transform (IFFT).

16. The device of claim 10 wherein the processor is configured to determine an actual common sample period between the impulse responses based on a sample rate associated with each of the S-parameters sets.

17. The device of claim 10 wherein the processor is configured to convert time domain zero filled S-parameter impulses to frequency domain using a Fast Fourier Transform (FFT).

18. The device of claim 14 wherein the processor is configured to truncate lower frequency and high frequency points that are extrapolated.

19. A non-transitory computer readable medium having stored thereon a computer program for execution by a processor configured to perform a method of re-sampling a plurality of S-parameters for serial data link analysis, the method comprising:
storing a plurality of S-parameters sets, each S-parameter set being associated with a subsystem and having an associated impulse responses and a time interval;
determining an increased time interval based on the time interval associated with each S-parameter set;
zero filling the impulse responses in each S-parameter set to maintain any wrapped ripples and increase the time interval and generating a plurality of resampled S-parameter sets with a finer frequency resolution to cover the increased time interval.

20. The non-transitory computer readable medium of claim 19 wherein the impulse responses in each S-parameter set are zero filled at a zero fill location based on a ripple threshold.

21. The non-transitory computer readable medium of claim 19 wherein the impulse responses in each S-parameter set are zero filled at a zero fill location based on a percentage of the time interval associated with each S-parameter set.

* * * * *